(12) United States Patent
Huang et al.

(10) Patent No.: US 6,952,335 B2
(45) Date of Patent: Oct. 4, 2005

(54) SOLID-STATE DC CIRCUIT BREAKER

(75) Inventors: Qin Huang, Blacksburg, VA (US); Xigen Zhou, Blacksburg, VA (US); Zhenxue Xu, Blacksburg, VA (US)

(73) Assignee: Virginia Tech Intellectual Properties, Inc., Blacksburg, VA (US)

( * ) Notice: Subject to any disclaimer, the term of this patent is extended or adjusted under 35 U.S.C. 154(b) by 296 days.

(21) Appl. No.: 10/390,712

(22) Filed: Mar. 19, 2003

(65) Prior Publication Data
US 2003/0183838 A1 Oct. 2, 2003

Related U.S. Application Data

(60) Provisional application No. 60/366,255, filed on Mar. 22, 2002.

(51) Int. Cl.[7] ................................................. H02H 3/00
(52) U.S. Cl. ...................................... 361/100; 361/91.8
(58) Field of Search ........................... 327/438; 361/100, 361/91.8

(56) References Cited

U.S. PATENT DOCUMENTS

| | | | | |
|---|---|---|---|---|
| 4,581,543 A | * | 4/1986 | Herberg ..................... 327/438 |
| 5,262,691 A | * | 11/1993 | Bailey et al. ............... 327/440 |
| 6,163,200 A | * | 12/2000 | Iijima ......................... 327/438 |
| 6,426,666 B1 | * | 7/2002 | Li et al. ...................... 327/438 |
| 6,710,639 B2 | * | 3/2004 | Huang et al. ............... 327/438 |

OTHER PUBLICATIONS

Xu et al., The Emiter turn–Off thyristor–Based DC Circuit Breaker Jan. 27, 2002 IEEE pp. 288–293 vol. 1.*

* cited by examiner

Primary Examiner—Ronald Leja
(74) Attorney, Agent, or Firm—Whitham, Curtis & Christofferson, PC

(57) ABSTRACT

A high-speed, solid-state circuit breaker is capable of interrupting high DC currents without generating an arc, and it is maintenance-free. Both the switch and the tripping unit are solid-state, which meet precise protection requirements. The high-speed, solid-state DC circuit breaker uses an emitter turn-off (ETO) thyristor as the switch. The ETO thyristor has an anode, a cathode and first, second and third gate electrodes. The anode is connectable to a source of DC current, and the cathode is connectable to a load. A solid-state trip circuit is connected to the first, second and third gate electrodes for controlling interrpution of DC current to the load by turning off said ETO thyristor.

20 Claims, 7 Drawing Sheets

SOLID-STATE DC CIRCUIT BREAKER

CROSS REFERENCE TO RELATED APPLICATION

This application claims the benefit of provisional application No. 60/366,255 filed Mar. 22, 2002.

This application is related in subject matter to U.S. patent application Ser. No. 09/486,779 filed Mar. 2, 2000, by Alex Q. Huang for "Emitter Turn-off Thyristors (ETO)", the disclosure of which is incorporated herein by reference.

BACKGROUND OF THE INVENTION

1. Field of the Invention

The present invention generally relates to electric circuit breakers and, more particularly, to a new high-current, solid-state DC circuit breaker in which both the switch and the tripping circuit are solid-state.

2. Background Description

Mechanical circuit breakers are dominant in the prior art. A full range of mechanical circuit breakers are available from a variety of manufacturers with voltage ratings up to 550 kV and current ratings up to 63 kA. Mechanical circuit breakers take milliseconds to interrupt current and generate an arc during the turn-off transient.

There are some so-called solid-state circuit breakers on the market, but the actual circuit breaker is mechanical, only the tripping circuit is solid-state. For example, a hybrid circuit breaker manufactured by Mitsubishi Electric Power Products, Inc., under the trade names Light Speed™ SSTS & Light Speed™ SSB is implemented with a vacuum switch and highly rated thyristor elements. The response time of this hybrid circuit breaker is limited by the mechanical vacuum switch. The Light Speed™ SSTS circuit breaker is capable of less than quarter-cycle energy transfers, while the Light Speed™ SSB circuit breaker provides half-cycle circuit interruptions. Toshiba Power Electronics Equipment manufactures a thyristor rectifier/thyristor inverter/gate turn-off thyristor (GTO) circuit breaker capable of 1500V/7500A rating, but requires a half-cycle (>8 ms) to turn-off the fault current.

SUMMARY OF THE INVENTION

It is therefore an object of the present invention to provide a high-speed, solid-state circuit breaker capable of interrupting high DC currents.

According to the invention, there is provided a solid-state DC circuit breaker which is capable of interrupting 5,000 amperes (5 kA) in four microseconds (4 µs). No arc is generated, and it is maintenance-free. Both the switch and the tripping unit are solid-state, which meet precise protection requirements. According to the invention, the high-speed, solid-state DC circuit breaker comprises an emitter turn-off (ETO) thyristor having an anode, a cathode and first, second and third gate electrodes. The anode is connectable to a source of DC voltage, and the cathode is connectable to a load. A solid-state trip circuit is connected to the first, second and third gate electrodes for controlling interrpution of DC current to the load by turning off said ETO thyristor.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1:
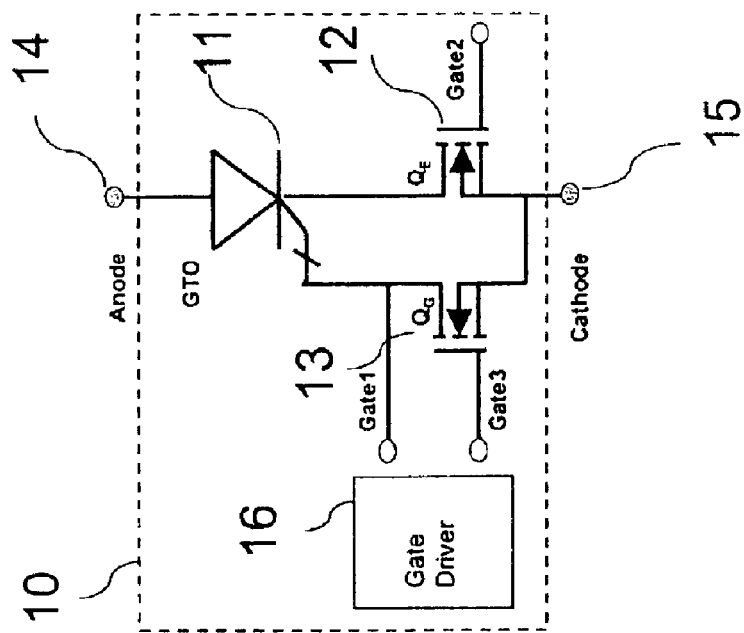
FIG. 1 is a schematic diagram of the basic emitter turn-off (ETO) thyristor as used in the practice of the invention.

Referring now to the drawings, and more particularly to FIG. 1, there is shown the basic emitter turn-off (ETO) thyristor as used in the practice of certain aspects of the invention. The ETO thyristor is described in more detail in copending U.S. patent application Ser. No. 09/486,779, the disclosure of which is incorporated herein by reference.

The ETO thyristor is a new power semiconductor device developed in the Center for Power Electronics Systems (CPES) at Virginia Tech. One intrinsic aspect of the ETO thyristor is the positive temperature coefficient of device on-conduction resistance, which guarantees current sharing between devices. Another impressive aspect of the ETO thyristor is the built-in current sensing. The 5 kA interruption capability has been tested and a 4 µs turn-off time has been achieved. No arc is generated, and it is virtually maintenance-free.

FIG. 1 shows the ETO thyristor 10 equivalent circuit. The gate turn-off (GTO) thyristor 11 is a four-layer semiconductor device of the structure PNPN, usually fabricated on a single wafer up to six inches in diameter. In the on-state it exhibits a latching behavior which enables it to achieve very low conduction loss at a high current density. The ETO thyristor has an additional switch 12 in series with the cathode of the GTO thyristor. The cathode of the GTO thyristor 11 is the emitter of the internal NPN transistor, so the series switch 12 is referred to as the emitter switch. Turning off this switch applies a high transient voltage long enough to commutate the current from the cathode to the gate of the GTO thyristor 11 so that unity-gain is achieved. An additional switch 13 is connected to the gate of the GTO thyristor, and is complementary to the emitter switch. These switches are implemented with a number of paralleled low-voltage, high-current metal oxide semiconductor field effect transistors (MOSFETs).

In its basic form as shown in FIG. 1, the ETO thyristor has an Anode 14, which is the anode of the GTO thyristor 11, a Cathode 15, which is the source of MOSFET 12, and three control electrodes, Gate1, which is the gate of the GTO thyristor 11, Gate2, which is the gate of the MOSFET 12, and Gate3, which is the gate of the MOSFET 13. The three control electrodes are controlled by gate driver circuit 16.

In the present invention, a high current, high speed solid-state DC circuit breaker is built based on the ETO thyristor technology. The ETO-based DC circuit breaker shortens the turn-off time from milliseconds to microseconds, providing fast protection for critical loads. Since both the switch and the tripping unit are solid-state, it is easy to meet the requirements for precise protection. And the solid-state DC circuit breaker has a flexible interface and is easy to control. The ETO-based DC circuit breaker shows superior performance to mechanical circuit breakers without increasing cost of manufacture. It can be used in electric traction systems, mining trolley systems, power stations and industrial applications.

Figure 2:
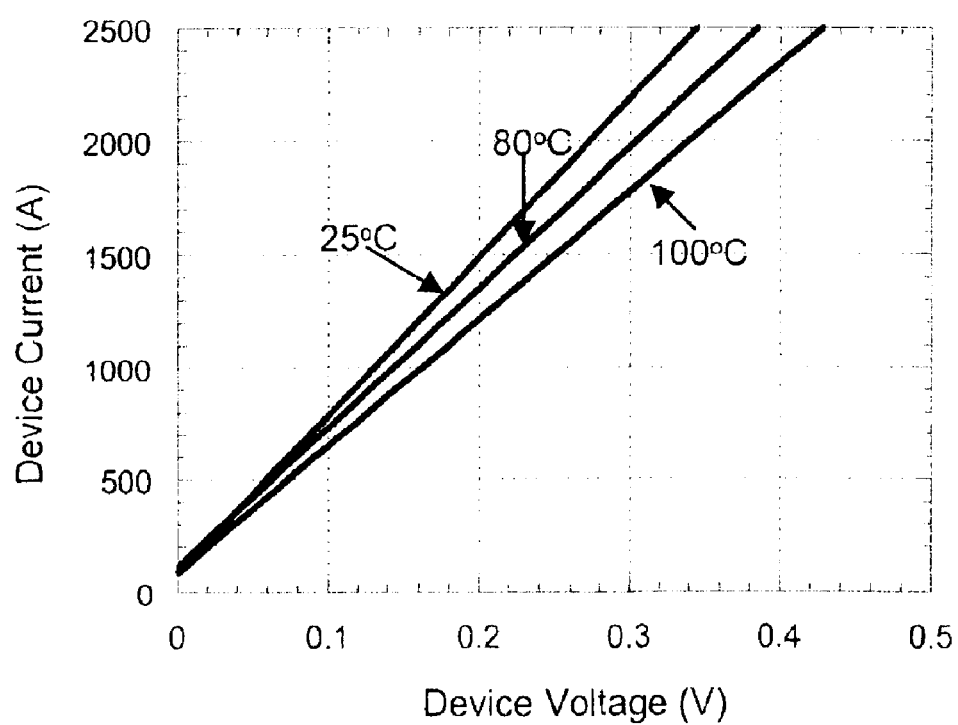
FIG. 2 is a graph showing the ETO thyristor built-in current sensing mechanism.

FIG. 2 is a graph showing the built-in current sensing mechanism of the ETO thyristor. The emitter switch 12 behaves like a resistor during the turn on-state. Hence, the voltage drop on the emitter switch 12 reflects the current flowing through the device. In other words, the ETO thyristor has an intrinsic MOSFET to sense the device current. The MOSFET voltage drop is proportional to the device current. The voltage falls into the 0 to 0.5 volt range, which can be directly picked by a differential amplifier. Further investigation revealed that the resistance varies with the temperature of the emitter switch 12. It has a positive temperature coefficient. After temperature compensation, the current can be extracted. This built-in current sensing technology can be used for device protection.

Figure 3:
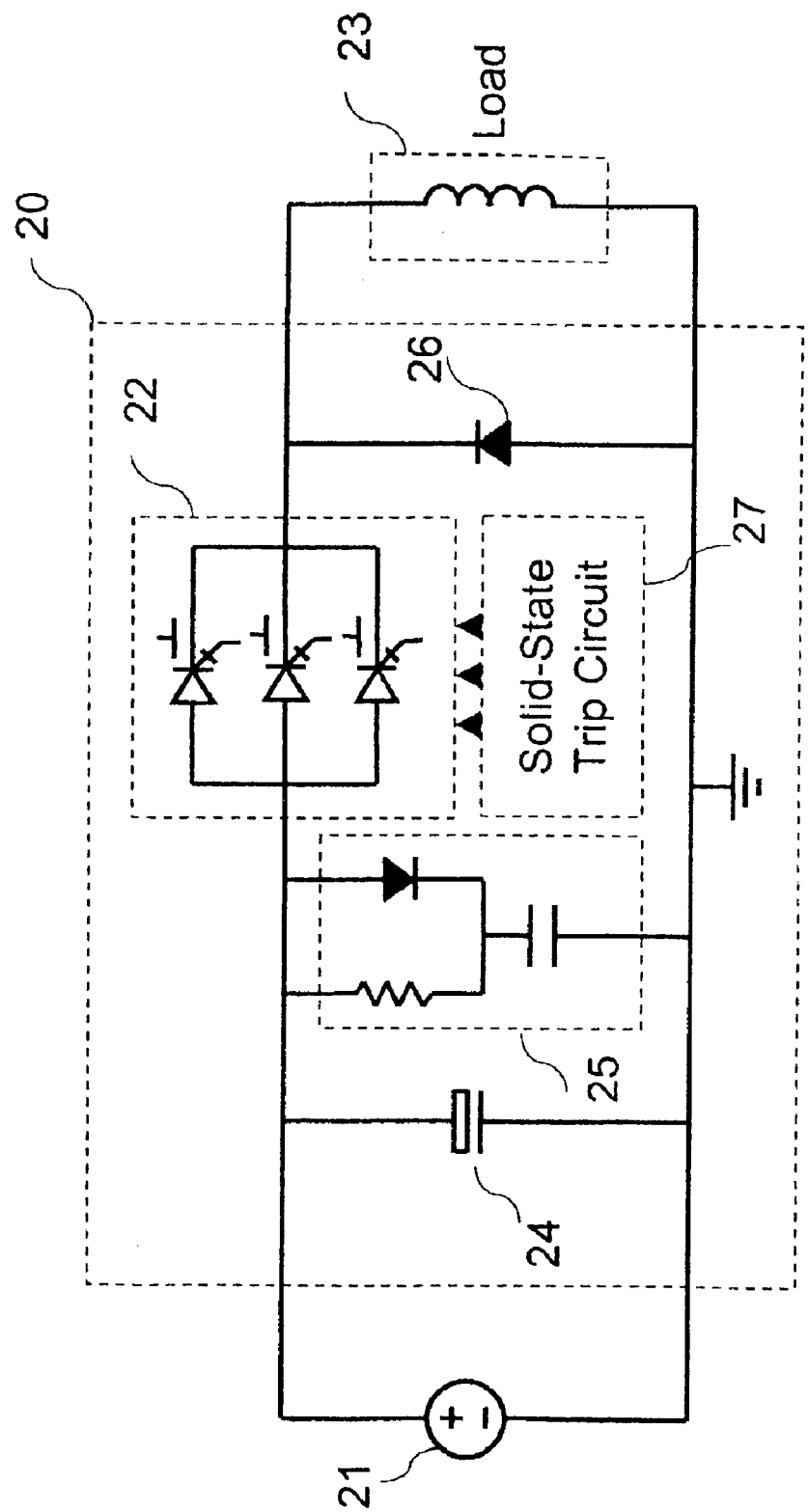
FIG. 3 is a schematic diagram showing a first configuration of the ETO-based DC circuit breaker with an RCD clamp.

FIG. 3 shows one possible configuration of the ETO-based circuit breaker according to the invention. The DC voltage source 21 is connected through the solid-state circuit breaker 20 to a load 23. The solid-state circuit breaker consists of an input clamping capacitor 24 connected across the DC voltage source 21, which absorbs the up-stream inductor energy during current interruption, an RCD clamp 25 connected across the DC voltage source 21, which limits the voltage spike on the ETO-based circuit breaker, and a free-wheeling diode 26 connected across the load 23, which is used to provide an alternative path for the load current. While the ETO thyristor withstands high voltage stress during current interruption, it requires a large clamping capacitor in the clamp 25 at high current rating. This configuration is suitable for high current DC circuit breaker applications. The clamp 25 can be replaced by other voltage limiting devices, such a Metal Oxide Varistor (MOV). The ETO thyristor 22 connects the positive terminal of the DC voltage source 21 to the positive terminal of the load 23. The load is represented as an inductor because most industrial loads are inductive. A solid-state trip circuit 27, described in more detail hereinafter, controls the ETO thyristor 22. As schematically indicated, several ETO thyristors may be paralleled to share the current. In a specific implementation, three ETO thyristor devices were tested and found to be good at current sharing during steady state and in switching transition. The on-state resistance has intrinsic positive temperature coefficient, which ensures device current sharing.

Figure 4:
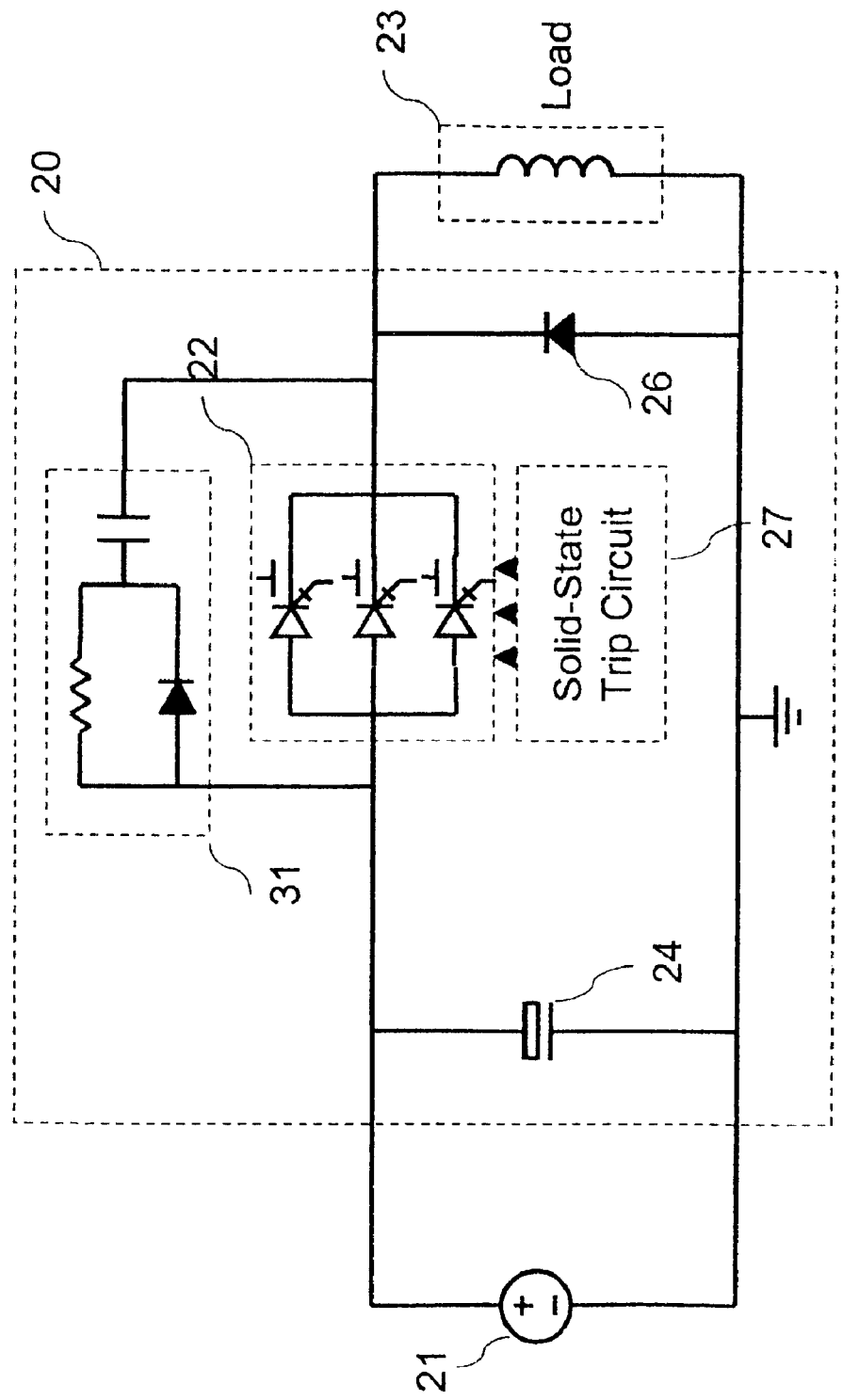
FIG. 4 is a schematic diagram showing a second configuration of the ETO-based DC circuit breaker with an RCD snubber.

FIG. 4 shows another possible configuration of the ETO-based circuit breaker according to the invention. As in the configuration shown in FIG. 3a, the DC voltage source 21 is connected through circuit breaker 20 to a load 23. The solid-state circuit breaker 20 in this configuration consists of an input clamping capacitor 24 connected across the DC voltage source 21, which absorbs the up-stream inductor energy during current interruption, an RCD snubber 31 connected across the ETO thyristor 22, which is used to limit the voltage spike on the ETO-based circuit breaker, and a free-wheeling diode 26, which provides an alternative path for the load current. A solid-state trip circuit 27, described in more detail hereinafter, controls the ETO thyristor 22. As schematically indicated, several ETO thyristors may be paralleled to share the current. This configuration adopts the RCD snubber 31 to limit the voltage spike by providing a commutation path for the interrupted current. The dv/dt slope can be adjusted by proper choice of the snubber capacitor. The RCD snubber 31 can be replaced by other voltage limiting devices, such as a MOV. The ETO thyristor withstands low voltage stress during current interruption. This configuration is suitable for high voltage, high current DC circuit breaker applications.

Figure 5:
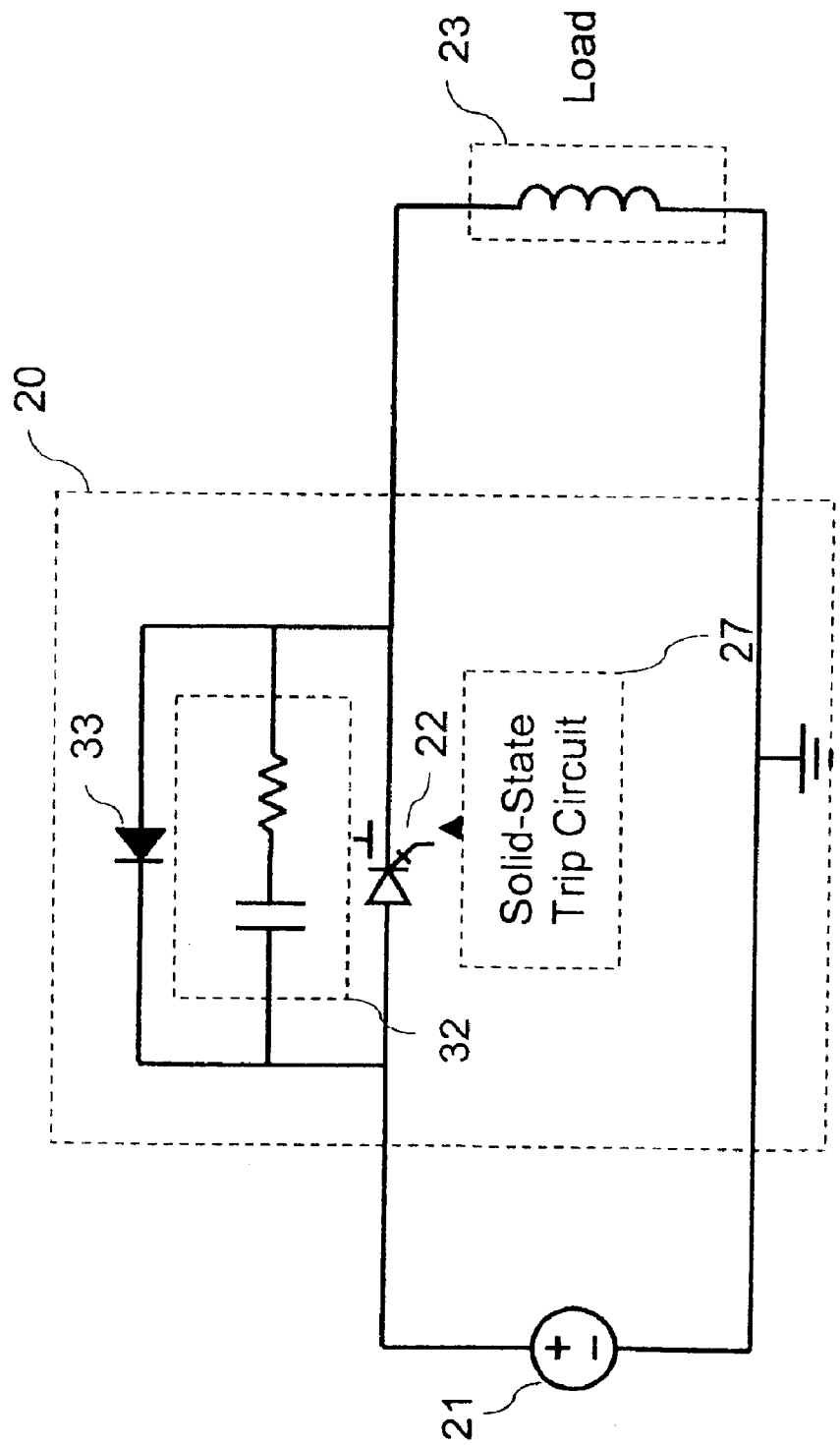
FIG. 5 is a schematic diagram showing a third configuration of the ETO-based DC circuit breaker with an RC snubber.

FIG. 5 shows a third possible configuration of the ETO-based circuit breaker according to the invention. As in the first configuration, the DC voltage source 21 is connected through the solid-state circuit breaker 20 to a load 23. In this configuration, the solid-state circuit breaker 20 consists of an RC snubber 32 connected in parallel with the ETO thyristor 22, which is used to limit the voltage spike on the ETO-based circuit breaker, and an anti-parallel diode 33, which is used to provide a reverse current path for the load during regeneration. The anti-parallel diode 33 replaces the free-wheeling diode 26 in the first two configurations. The dv/dt slope can be adjusted by proper choice of the snubber capacitor. A solid-state trip circuit 27, described in more detail hereinafter, controls the ETO thyristor 22. The ETO thyristor 22 withstands low voltage stress during current interruption. This configuration is suitable for high voltage DC circuit breaker applications.

A particular advantage of the ETO-based circuit breaker according to the invention is that we use a 2-port network to implement the circuit breaker. This allows easy desegmentation of the faulted DC network from the healthy DC networks without causing high stress at the source side or the load side.

Figure 6:
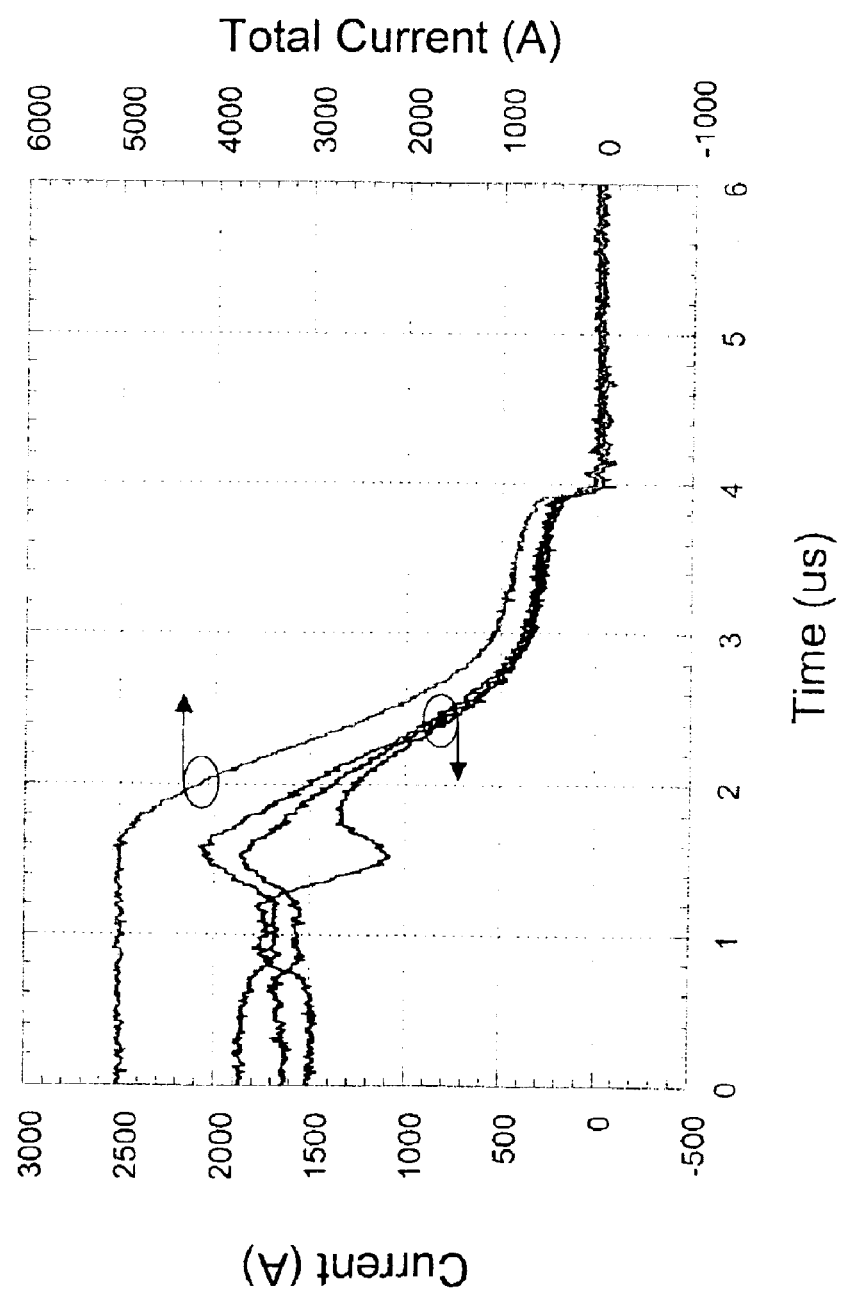
FIG. 6 is a graph showing test results of 5 kA current interruption experiment using the first configuration of the ETO-based DC circuit breaker.

Test results for the configuration shown in FIG. 3 are shown in FIG. 6. These results were obtained in a 5 kA interruption experiment. As seen in the graph, the ETO-based DC circuit breaker safely interrupted 5 kA in 4 $\mu$s. Three ETO thyristors were used in parallel. The critical issue associated with parallel operation is current sharing. From FIG. 6, we see that current decreases to zero after current regulation between the devices. The turn-off time of 4 $\mu$s can meet the harsh requirements for most critical and sensitive loads.

Figure 7:
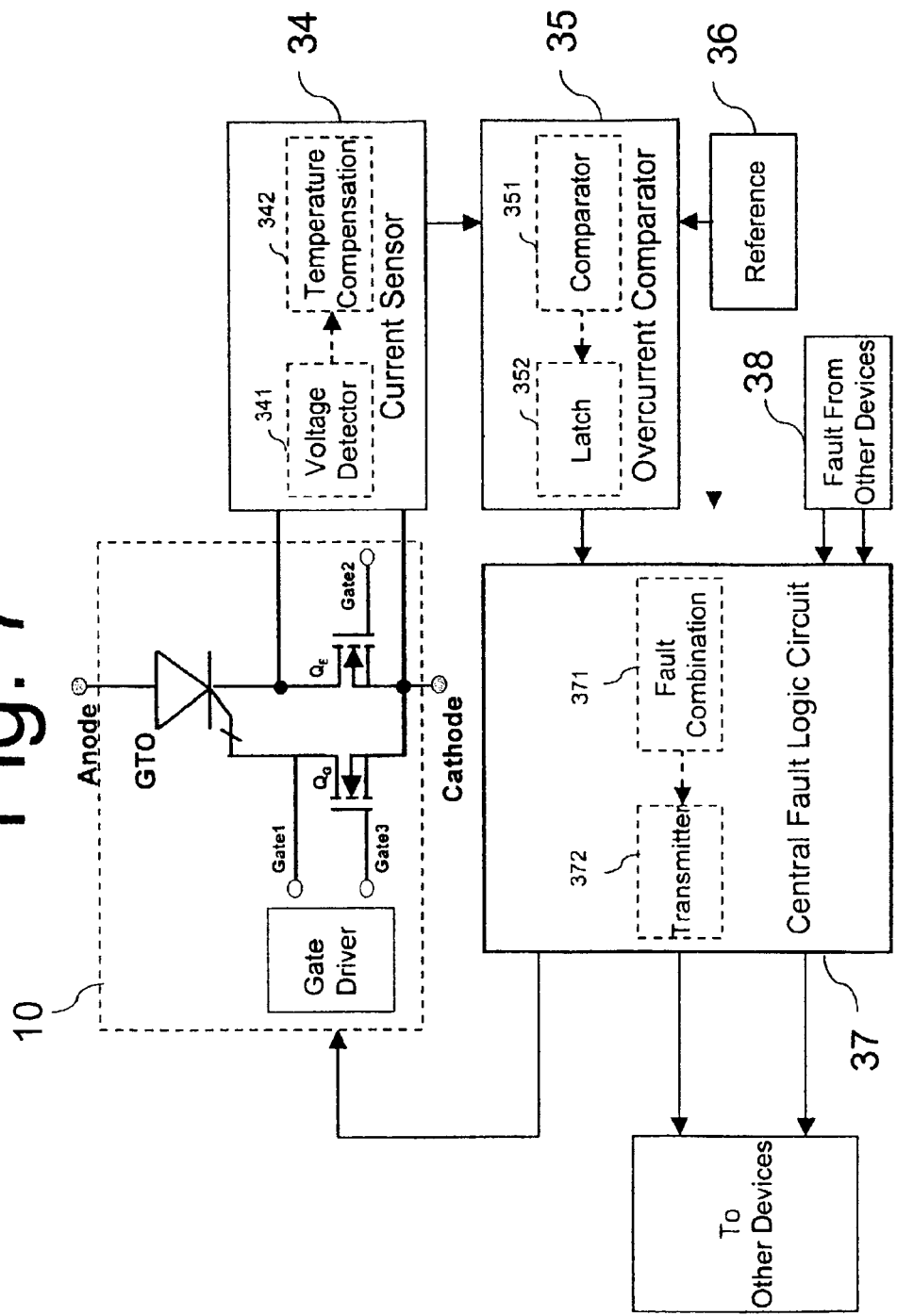
FIG. 7 is a block and schematic diagram of the solid-state trip circuit according to the invention.

FIG. 7 shows the solid-state trip circuit 27 used in the configurations of FIGS. 3, 4 and 5. A current sensor circuit 34 detects the emitter switch voltage of the ETO thyristor 10. The current sensor includes a voltage sensor 341 and a temperature compensation circuit 342. The current sensor circuit 34, after temperature compensation, calculates the conduction current. An over current comparator 35 compares the device current from the current sensor circuit 34 with a precise voltage reference 36. The over current comparator 35 includes a comparator 351 and a latch 352. If the device current exceeds the predefined reference, the over current comparator 35 will generate a fault signal and latch it. A central fault logic circuit 37 receives the fault signal from the over current comparator 35 and fault signals from other devices 38. The central fault logic circuit 37 includes a fault combination circuit 371 and a transmitter 372. After fault combination, the central fault logic circuit 37 transmits the fault signal to all the ETO devices, shutting down all the ETO devices and interrupting the fault current.

While the ETO-based DC circuit breaker according to the preferred embodiments of the invention utilizes the device built-in current sensor, it does not exclude the use of an external current sensor, for instance a Hall effect current sensor located in the load side to replace the current sensor 34.

While the invention has been described in terms of preferred embodiments, those skilled in the art will recognize that the invention can be practiced with modification within the spirit and scope of the appended claims.

Having thus described our invention, what we claim as new and desire to secure by Letters Patent is as follows:

1. An high-speed, solid-state DC circuit breaker comprising:
   a solid-state switch providing unidirectional current flow from a source of DC voltage to a load when in an on-state, the solid-state switch being comprised of an emitter turn-off (ETO) thyristor having an anode, a cathode, and first, second and third gates as control electrodes, the anode being connectable to the source of DC voltage and the cathode being connectable to the load; and
   a solid-state trip circuit connected to the first, second and third gates for controlling interruption of DC current to the load by turning off said ETO thyristor.

2. The high-speed, solid-state DC circuit breaker of claim 1, wherein the ETO thyristor includes a built-in current sensing mechanism.

3. The high-speed, solid-state DC circuit breaker of claim 2, further comprising:
   an input clamping capacitor connectable across the DC voltage source, which absorbs the up-stream inductor energy during current interruption;
   an RCD clamp connectable across the DC voltage source, which limits the voltage spike on the ETO-based circuit breaker; and
   a free-wheeling diode connectable across the load, which is used to provide an alternative path for the load current.

4. The high-speed, solid-state DC circuit breaker of claim 2, further comprising:
   an input clamping capacitor connectable across the DC voltage source, which absorbs the up-stream inductor energy during current interruption;
   an RCD snubber connected across the ETO thyristor, which is used to limit the voltage spike on the ETO-based circuit breaker; and
   a free-wheeling diode connectable across the load, which provides an alternative path for the load current.

5. The high-speed, solid-state DC circuit breaker of claim 2, further comprising:
   an RC snubber connected in parallel with the ETO thyristor, which is used to limit the voltage spike on the ETO-based circuit breaker; and
   an anti-parallel diode connected across the ETO thyristor, which is used to provide a reverse current path for the load during regeneration.

6. The high-speed, solid-state DC circuit breaker of claim 1, further comprising a plurality of ETO thyristors connected in parallel.

7. The high-speed, solid-state DC circuit breaker of claim 1, wherein the circuit breaker is configured as a 2-port network.

8. The high-speed, solid-state DC circuit breaker of claim 1, wherein the ETO thyristor comprises:
   a gate turn-off (GTO) thyristor having an anode, a cathode and a gate, wherein the anode of the GTO thyristor is the anode of the ETO thyristor;
   a series switch, referred to as an emitter switch, connected between the cathode of the GTO thyristor and the cathode of the ETO thyristor, whereby turning off the emitter switch applies a high transient voltage long enough to commutate current from the cathode to the gate of the GTO thyristor so that unity-gain is achieved; and
   an additional switch connected to the gate of the GTO thyristor and complementary to the emitter switch, the gate of the GTO thyristor constituting the first gate electrode, a control electrode of the emitter switch constituting the second gate electrode, and a control electrode of the additional switch constituting the third control electrode.

9. The high-speed, solid-state DC circuit breaker of claim 8, further comprising a gate driver circuit connected to said first, second and third gate electrodes.

10. The high-speed, solid-state DC circuit breaker of claim 8, further comprising:
    an input clamping capacitor connectable across the DC voltage source, which absorbs the up-stream inductor energy during current interruption;
    an RCD clamp connectable across the DC voltage source, which limits the voltage spike on the ETO-based circuit breaker; and
    a free-wheeling diode connectable across the load, which is used to provide an alternative path for the load current.

11. The high-speed, solid-state DC circuit breaker of claim 8, further comprising:
    an input clamping capacitor connectable across the DC voltage source, which absorbs the up-stream inductor energy during current interruption;
    an RCD snubber connected across the ETO thyristor, which is used to limit the voltage spike on the ETO-based circuit breaker; and
    a free-wheeling diode connectable across the load, which provides an alternative path for the load current.

12. The high-speed, solid-state DC circuit breaker of claim 8, further comprising:
    an RC snubber connected in parallel with the ETO thyristor, which is used to limit the voltage spike on the ETO-based circuit breaker; and
    an anti-parallel diode connected across the ETO thyristor, which is used to provide a reverse current path for the load during regeneration.

13. The high-speed, solid-state DC circuit breaker of claim 8, wherein the solid-state trip circuit comprises:
    a current sensor circuit detecting the emitter switch voltage, the current sensor circuit calculating conduction current;
    an over current comparator comparing the calculated conduction current from the current sensor circuit with a predefined reference and, if the calculated conduction current exceeds the predefined reference, generating a fault signal; and
    a fault logic circuit connected to receive the fault signal from the over current comparator and transmitting the fault signal to all the ETO thyristor, shutting down the ETO thyristor and interrupting a fault current.

14. The high-speed, solid-state DC circuit breaker of claim 13, wherein the current sensor includes a voltage sensor and a temperature compensation circuit and the over current comparator includes a comparator and a latch.

15. The high speed, solid-state DC circuit breaker of claim 13, wherein the fault logic circuit is a central fault logic circuit which receives fault signals from other devices and, after combination of fault signals, transmits a fault signal to all devices, shutting down the devices and interrupting a fault currents.

16. The high speed, solid-state DC circuit breaker of claim 15, wherein the central fault logic circuit includes a fault combination circuit and a transmitter.

17. The high-speed, solid-state DC circuit breaker of claim 13, wherein the ETO thyristor includes a built-in current sensing mechanism.

18. The high-speed, solid-state DC circuit breaker of claim 13, further comprising a plurality of ETO thyristors connected in parallel.

19. The high-speed, solid-state DC circuit breaker of claim 13, wherein the circuit breaker is configured as a 2-port network.

20. The high-speed, solid-state DC circuit breaker of claim 13, wherein the solid-state trip circuit includes a built-in current sensor.

* * * * *